US012704524B2

(12) United States Patent
Moon et al.

(10) Patent No.: US 12,704,524 B2
(45) Date of Patent: Aug. 11, 2026

(54) METHOD AND APPARATUS FOR TESTING A SEMICONDUCTOR DEVICE

(71) Applicant: STATS ChipPAC Pte. Ltd., Singapore (SG)

(72) Inventors: ZunBae Moon, Gyeonggi-do (KR); WonJung Kim, Incheon (KR); KyouYong Han, Incheon (KR)

( * ) Notice: Subject to any disclaimer, the term of this patent is extended or adjusted under 35 U.S.C. 154(b) by 353 days.

(21) Appl. No.: 18/312,604

(22) Filed: May 5, 2023

(65) Prior Publication Data

US 2023/0358784 A1 Nov. 9, 2023

(30) Foreign Application Priority Data

May 9, 2022 (CN) ......................... 202210489114.1

(51) Int. Cl.
*G01R 1/04* (2006.01)
*G01R 1/067* (2006.01)

(52) U.S. Cl.
CPC ....... *G01R 1/0433* (2013.01); *G01R 1/06722* (2013.01)

(58) Field of Classification Search
CPC .......................... G01R 1/0433; G01R 1/06722
See application file for complete search history.

(56) References Cited

U.S. PATENT DOCUMENTS 5,155,440 A * 10/1992 Huang .................. G01R 31/58 324/66
5,929,627 A * 7/1999 MacPherson .......... H01G 2/065 324/763.01
6,734,683 B2 5/2004 Hash
6,786,760 B1 9/2004 Benavides et al.
7,498,180 B2 * 3/2009 Yamashita ......... G01R 31/2863 438/11

(Continued)

FOREIGN PATENT DOCUMENTS

CN 1072361 C 10/2001
CN 102221939 A 10/2011

(Continued)

OTHER PUBLICATIONS

The Office Action for the counterpart Korean patent application 10-2023-0048670, mailed on Jun. 15, 2026.

*Primary Examiner* — Paresh Patel
(74) *Attorney, Agent, or Firm* — Junhe Law Office, P.C.; Yi Zhang

(57) ABSTRACT

A method and an apparatus for testing a semiconductor device are provided. The apparatus includes: one or more ground contacts configured for coupling to one or more ground terminals of the semiconductor device respectively; and a detection module having one or more inputs coupled to the one or more ground contacts respectively, and configured to detect electrical conditions at the one or more ground contacts; wherein, when the semiconductor device is mounted on the test apparatus, a first signal is generated at an output of the detection module if all of the one or more ground contacts are coupled to the one or more ground terminals of the semiconductor device, and a second signal different from the first signal is generated at the output of the detection module if at least one of the one or more ground contacts is not coupled to the one or more ground terminals.

14 Claims, 7 Drawing Sheets

(56) References Cited

U.S. PATENT DOCUMENTS

| | | | | |
|---|---|---|---|---|
| 9,513,333 | B2 | 12/2016 | Song et al. | |
| 9,668,356 | B2 | 5/2017 | Syal et al. | |
| 2005/0224971 | A1* | 10/2005 | Suehiro | H05K 1/111 257/E23.079 |
| 2007/0015311 | A1* | 1/2007 | Kobae | H01L 24/11 257/E21.511 |
| 2007/0120551 | A1* | 5/2007 | Shin | G01K 1/026 324/71.5 |
| 2008/0215765 | A1* | 9/2008 | Butler | G06F 1/3253 710/15 |
| 2010/0246152 | A1* | 9/2010 | Lin | H01L 23/481 361/783 |
| 2013/0300450 | A1* | 11/2013 | Kwak | G01R 31/66 324/762.01 |
| 2014/0145708 | A1* | 5/2014 | Wu | G06F 11/221 324/133 |
| 2015/0091390 | A1 | 4/2015 | Syal et al. | |
| 2016/0061861 | A1* | 3/2016 | Kim | G01R 31/2863 324/756.02 |
| 2017/0023633 | A1* | 1/2017 | Song | G01R 31/2879 |
| 2021/0004501 | A1 | 1/2021 | Xue et al. | |

FOREIGN PATENT DOCUMENTS

| | | | |
|---|---|---|---|
| TW | 386160 | B | 4/2000 |
| TW | 201626578 | A | 7/2016 |
| TW | 202146919 | A | 12/2021 |

* cited by examiner

METHOD AND APPARATUS FOR TESTING A SEMICONDUCTOR DEVICE

TECHNICAL FIELD

The present application generally relates to semiconductor technology, and more particularly, to a method and an apparatus for testing a semiconductor device.

BACKGROUND OF THE INVENTION

The semiconductor industry is constantly faced with complex integration challenges as consumers want their electronics to be smaller, faster and higher performance with more and more functionalities packed into a single device. With such needs, Ball Grid Array (BGA) type semiconductor packages which implement a high pin count by forming a plurality of external terminals having a ball shape at a bottom surface of a body portion thereof have been favored.

Semiconductor packages that have undergone complicated processing are subjected to various types of electrical tests so as to test their characteristics and for defects thereof. To this end, a test socket is used to electrically connect metallic wires or contact pads of a socket board (e.g., a printed circuit board) mounted in test equipment and external terminals of a semiconductor package to be tested. That is, when testing a semiconductor package, the test socket serves as an interface to electrically connect the socket board of the test equipment and the semiconductor package under test.

Therefore, a need exists for a high reliable test apparatus for testing a semiconductor device.

SUMMARY OF THE INVENTION

An objective of the present application is to provide a test apparatus with higher reliability.

According to an aspect of embodiments of the present application, a test apparatus for testing a semiconductor device is provided. The semiconductor device includes one or more ground terminals. The test apparatus includes: one or more ground contacts configured for coupling to the one or more ground terminals of the semiconductor device respectively; and a detection module having one or more inputs coupled to the one or more ground contacts respectively, and configured to detect electrical conditions at the one or more ground contacts; wherein, when the semiconductor device is mounted on the test apparatus for testing, a first signal is generated at an output of the detection module if all of the one or more ground contacts are coupled to the one or more ground terminals of the semiconductor device, and a second signal different from the first signal is generated at the output of the detection module if at least one of the one or more ground contacts is not coupled to the one or more ground terminals of the semiconductor device.

According to another aspect of embodiments of the present application, a method for testing a semiconductor device is provided. The method may include: providing a semiconductor device including one or more ground terminals; providing a test apparatus, wherein the test apparatus includes: one or more ground contacts configured for coupling to the one or more ground terminals of the semiconductor device respectively; and a detection module having one or more inputs coupled to the one or more ground contacts respectively, and configured to detect electrical conditions at the one or more ground contacts; mounting the semiconductor device on the test apparatus; generating an indication signal at an output of the detection module, wherein the indication signal has a first logic level if all of the one or more ground contacts are coupled to the one or more ground terminals of the semiconductor device, and the indication signal has a second logic level different from the first logic level if at least one of the one or more ground contacts is not coupled to the one or more ground terminals of the semiconductor device.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1:
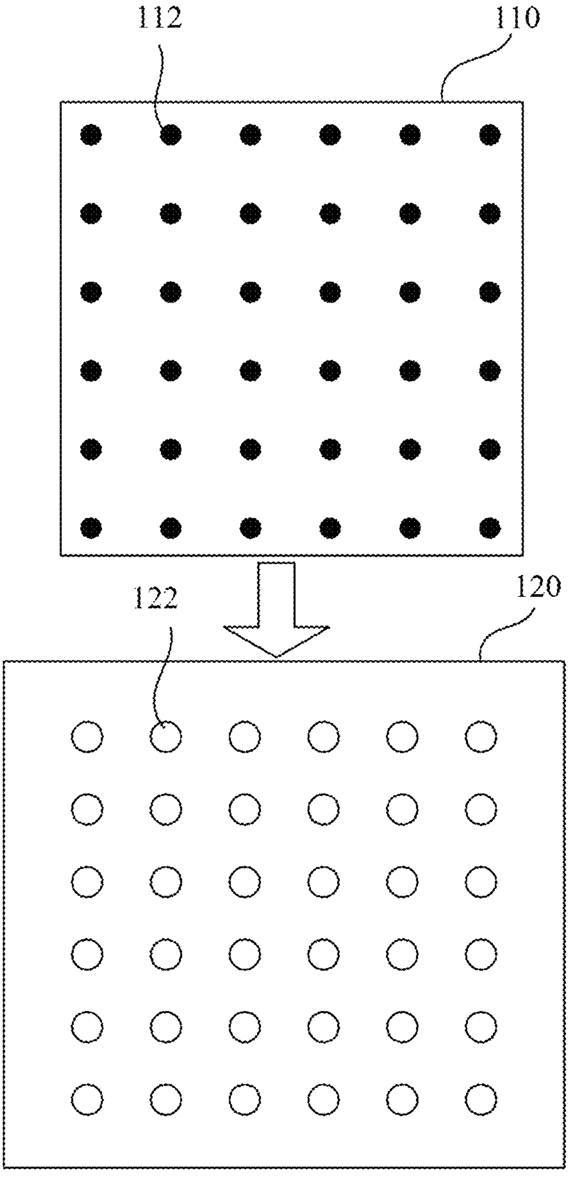
FIG. 1 is a bottom view of a semiconductor device and a top view a test socket.

FIG. 1 illustrates a bottom view of a semiconductor device 110 and a top view of test socket 120. As shown in FIG. 1, the semiconductor device 110 includes a plurality of terminals 112, and the test socket 120 include a plurality of test pins 122. The semiconductor device 110 can be placed on the test socket 120 to connect the plurality of terminals 112 with the plurality of test pins 122, respectively. Then, the semiconductor device 110 can be tested via the test socket 120 to see if there is any problem about the operation and performance of the semiconductor device 110.

However, the semiconductor device 110 may have a rotationally symmetric footprint (e.g., shaped as a square), and the terminals 112 can be placed on the test socket 120 in another direction different from that shown in FIG. 1. For example, the semiconductor device 110 can be rotated 180 degrees with its terminals still aligned with the test pins 122 of the test socket 120. Although the footprint of the semiconductor device 110 may be physically rotationally symmetric, the pin-out of the semiconductor device 110 is typically non-symmetric. If the semiconductor device 110 is incorrectly mounted on the test socket 120 (such as 90 degree rotated, 180 degree rotated, 270 degree rotated, flipped, or tilted), the semiconductor device 110 and/or the test socket 120 may be damaged due to a short circuit formed therebetween, for example, a short circuit between power pins and other signal pins (GNDs/digital IOs/analog IOs/other voltage level's power pins).

To address at least one of the above problems, in the embodiments of the present application, a test apparatus for testing a semiconductor device is provided. The test apparatus includes a detection module configured to detect electrical conditions at certain ground contacts of the test apparatus. When a semiconductor device under test (DUT) is mounted on the test apparatus for testing, the detection module can generate a first signal if all of the ground contacts of the test apparatus are coupled to respective ground terminals of the semiconductor device; moreover, the detection module can generate a second signal different from the first signal, if at least one of the ground contacts is not coupled to the ground terminals of the semiconductor device. Based on the output of the detection module, the test apparatus can determine whether the semiconductor device is correctly mounted on the test apparatus. For example, a user or an automatic test equipment can use the first signal generated by the detection module as an enable signal to apply an external power supply to a power contact of the test apparatus to start testing of the semiconductor device. In other words, if the semiconductor device is incorrectly mounted on the test apparatus, external power supply would not be applied to the semiconductor device and the power contact of the test apparatus, thereby avoiding circuit failures such as short circuit due to incorrect connection between the semiconductor device and the test apparatus.

Figure 2:
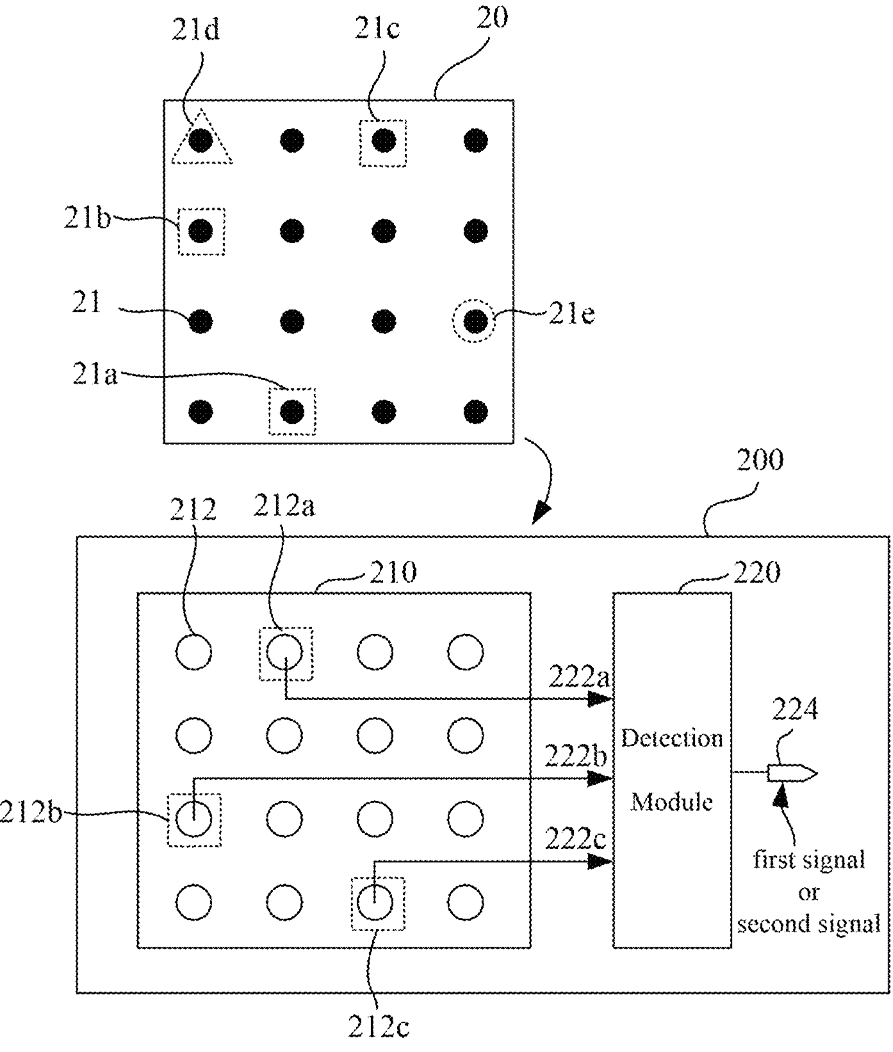
FIG. 2 is a diagram of a semiconductor device and a diagram of a test apparatus according to an embodiment of the present application.

FIG. 2 illustrates a diagram of a semiconductor device 20 and a diagram of a test apparatus 200 according to an embodiment of the present application.

As shown in FIG. 2, the semiconductor device 20 can be connected to the test apparatus 200 for testing. The semiconductor device 20 may include a semiconductor die with certain circuit modules. For example, the semiconductor device 20 may include a volatile memory device, a non-volatile memory device, or a non-memory device such as a microprocessor, a controller, a logic circuit, etc.

The semiconductor device 20 may include a plurality of terminals 21, which can be connected to the test apparatus 200. The terminals 21 may include at least one ground terminal (e.g., three ground terminals 21*a*, 21*b* and 21*c* shown in FIG. 2), at least one power terminal (e.g., a power terminal 21*d* shown in FIG. 2), and at least one signal terminal (e.g., a signal terminal 21*e* shown in FIG. 2). One or more signals can be transmitted through the terminals 21. For example, a power supply voltage can be applied to the semiconductor device 20 via the at least one power terminal, the at least one ground terminal of the semiconductor device 20 can be grounded, and commands, addresses and/or data can be transmitted via the at least one signal terminal. The power terminal, the ground terminal and the signal terminal may be defined in a datasheet of the semiconductor device 20.

In some embodiments, the semiconductor device 20 may be a semiconductor package encapsulating one or more semiconductor dice where the circuit modules are formed. The semiconductor device 20 may be in the form of an integrated package having a plurality of homogeneous or heterogeneous semiconductor packages. The semiconductor package may include, but not limited to, DIP, PGA, BGA, LGA, QFP, SOIC, LCC, BCC, and the like. The terminals 21 may have a variety of shapes, such as a ball shape, a pad shape, a lead shape, or a pin shape according to the shape of a package.

In some embodiments, the semiconductor device 20 may be an unpackaged semiconductor device such as a semiconductor die with contact pads as its terminals.

Continuing referring to FIG. 2, the test apparatus 200 includes a connection region 210 for connecting semiconductor devices such as the semiconductor device 20. A plurality of contacts 212 are arranged in the connection region 210. The plurality of contacts 212 may include at least one power contact, at least one ground contact (for example, three ground contacts 212*a*, 212*b* and 212*c* shown in FIG. 2), and at least one signal contact, which correspond to the same types of terminals of the semiconductor device 20, respectively. In a case where the semiconductor device 20 is a semiconductor package such as a Ball Grid Array (BGA) type semiconductor package, the connection region 210 may be a test socket, and the plurality of contacts 212 may be Pogo pins. In a case where the semiconductor device 20 is an unpackaged die, the connection region 210 may be a probe card with a plurality needle shaped contacts 212.

The test apparatus 200 further includes a detection module 220. In some embodiments, the detection module 220 may be formed on a flexible printed circuit board, and further assembled within the test apparatus 200. The detection module 220 has one or more inputs coupled to the ground contacts in the connection region 210, respectively. For example, as shown in FIG. 2, three inputs 222*a*, 222*b* and 222*c* of the detection module 220 are coupled to three ground contacts 212*a*, 212*b* and 212*c* in the connection region 210, respectively. The detection module 220 is configured to detect electrical conditions at the one or more ground contacts. For example, the detection module 220 can determine whether a ground contact is grounded or floated, etc. In a case where the semiconductor device 20 is mounted on the test apparatus 200 for testing, if all of the three ground contacts 212*a*, 212*b* and 212*c* of the test apparatus 200 are coupled to the three ground terminals 21*a*, 21*b* and 21*c* of the semiconductor device 20 respectively, the detection module 220 can generate a first signal at its output 224, indicating correct connection between the semiconductor device 20 and the test apparatus 200. However, if any of the three ground contacts 212*a*, 212*b* and 212*c* of the test apparatus 200 is not coupled correctly to a respective one of the three ground terminals 21*a*, 21*b* and 21*c* of the semiconductor device 20, the detection module 200 can generate a second signal different from the first signal at its output 224, indicating incorrect connection between the semiconductor device 20 and the test apparatus 200.

As discussed above, if the semiconductor device 20 is correctly mounted on the test apparatus 200, the three ground terminals 21*a*, 21*b* and 21*c* of the semiconductor device 20 can be aligned with and connected to the three ground contacts 212*a*, 212*b* and 212*c* in the connection region 210, respectively. In such case, the detection module 220 can output the first signal. In contrast, the second signal indicates incorrect connection. Thus, it can be determined whether the semiconductor device 20 is correctly mounted on the test apparatus 200 simply based on the output (i.e., the first signal or the second signal) of the detection module 220.

Although FIG. 2 illustrates that the semiconductor device 20 includes three ground terminals 21*a*, 21*b* and 21*c*, the test apparatus 200 includes three ground contacts 212*a*, 212*b* and 212*c*, and the detection module 220 includes three inputs 222*a*, 222*b* and 222*c*, they are exemplary and the present application is not limited by the number of the ground terminals, the number of the ground contacts, or the number of the inputs of the detection module. For example, in an example, the semiconductor device 20 may include more than three ground terminals, but only three of them are selected to connect three inputs of the detection module via three ground terminals of the test apparatus 200.

Figure 3:
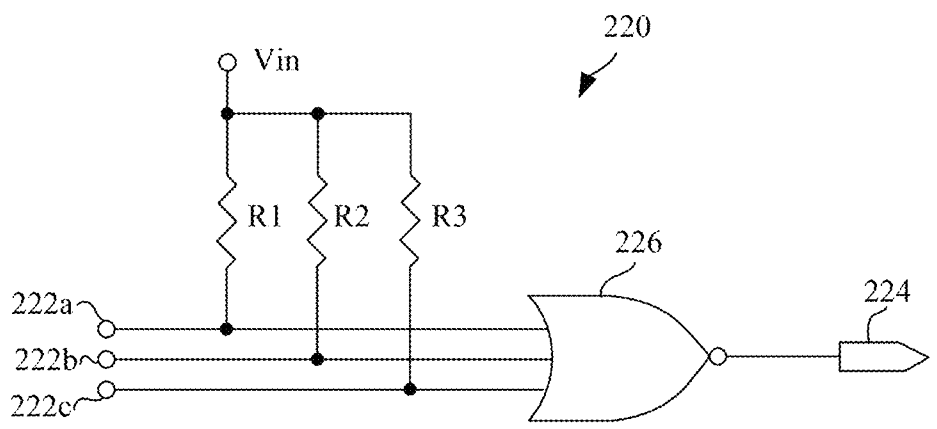
FIG. 3 is a circuit diagram of the detection module shown in FIG. 2 according to an embodiment of the present application.

FIG. 3 illustrates a circuit diagram of the detection module 220 shown in FIG. 2 according to an embodiment of the present application.

As shown in FIG. 3, the detection module 220 includes a multi-input NOR gate 226. The NOR gate 226 includes three inputs 222*a*, 222*b* and 222*c*, which are coupled to an external power supply Vin through three resistors R1, R2 and R3 respectively. In an example, the NOR gate 226 may be a SN74HCs27 three-input NOR gate commercially available from TEXAS INSTRUMENTS, which has a rated power supply voltage from 2V to 6V. With reference to an exemplary operation of the NOR gate 226, a truth table shown in Table 1 below may be utilized.

TABLE 1

Truth Table for Detection Module

| Input 222a | Input 222b | Input 222c | Output 224 |
|---|---|---|---|
| 0 | 0 | 0 | 1 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | 0 |

As can be seen from Table 1, the NOR gate 226 only outputs a logic high voltage (i.e., "1") when all the three inputs 222*a*, 222*b* and 222*c* receive a logic low voltage (i.e., "0"). In other cases, if at least one of the three inputs 222*a*, 222*b* and 222*c* receives a logic high voltage, the NOR gate 226 may output a logic low voltage. It should be understood that other circuits which can operate according to the truth table shown in Table 1 can also be used in the detection module 220, and the present application is not limited to the NOR gate 226 shown in FIG. 3. For example, a three-input OR gate and an inverter can be used to replace the NOR gate 226 shown in FIG. 3.

Figure 4A:
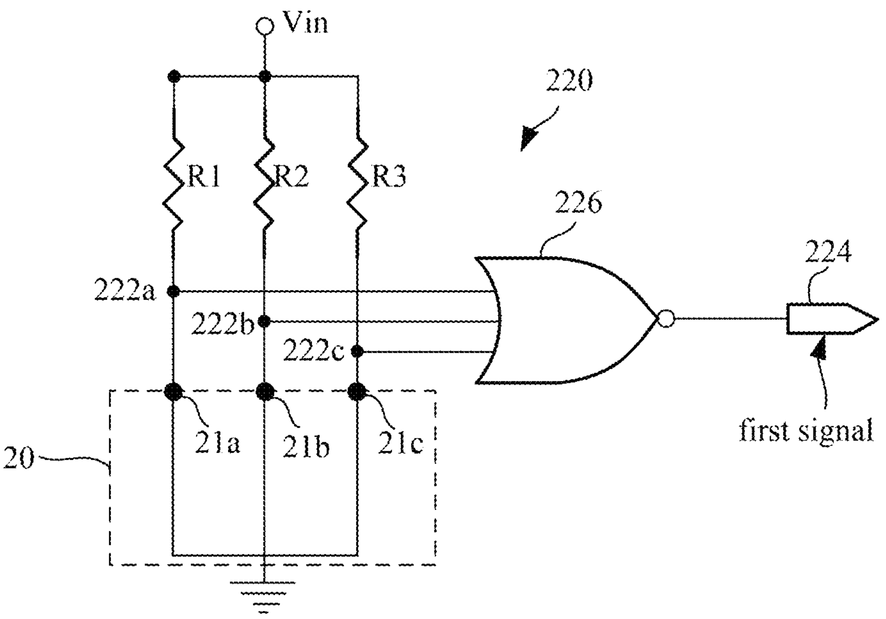
FIG. 4A is a schematic circuit of the detection module when the semiconductor device is correctly mounted on the test apparatus.
Figure 4B:
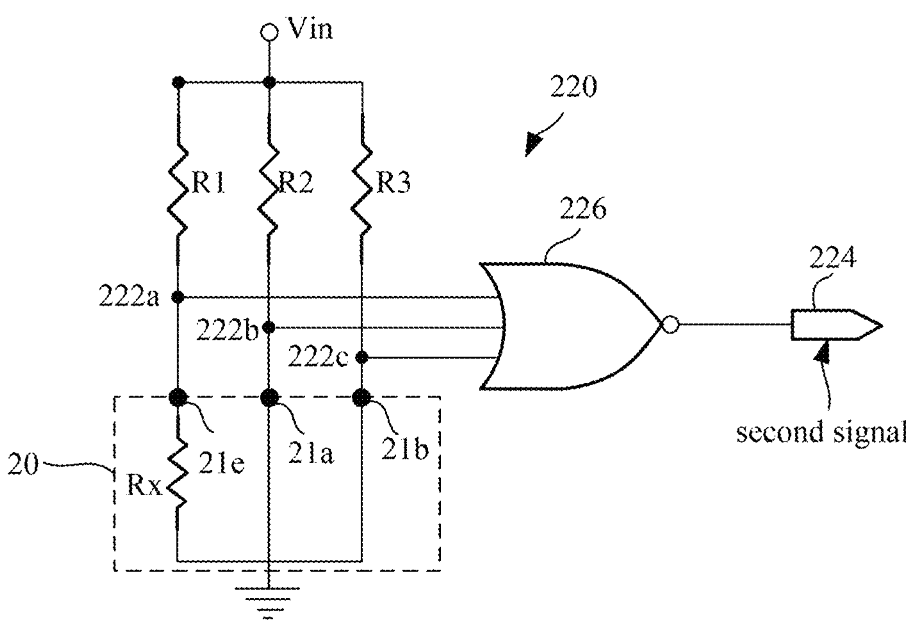
FIG. 4B is another schematic circuit of the detection module when the semiconductor device is incorrectly mounted on the test apparatus.

FIG. 4A illustrates a schematic circuit of the detection module 220 shown in FIG. 3 when the semiconductor device is correctly mounted onto the test apparatus, and FIG. 4B illustrates another schematic circuit of the detection module 220 when the semiconductor device is incorrectly mounted onto the test apparatus.

Referring to FIG. 4A, the three inputs 222*a*, 222*b* and 222*c* of the detection module 220 are connected to the three ground terminals 21*a*, 21*b* and 21*c* of the semiconductor device 20. For example, when the semiconductor device 20 is correctly mounted on the test apparatus 200 as shown in FIG. 2, the three ground terminals 21*a*, 21*b* and 21*c* of the semiconductor device 20 are respectively coupled to the three ground contacts 212*a*, 212*b* and 212*c* of the test apparatus 200, and then are respectively coupled to the three inputs 222*a*, 222*b* and 222*c* of the detection module 220. As the three ground terminals 21*a*, 21*b* and 21*c* of the semiconductor device 20 are connected to ground voltage (i.e., "0"), the detection module 220 may output a logic high voltage (i.e., "1").

Figure 4C:
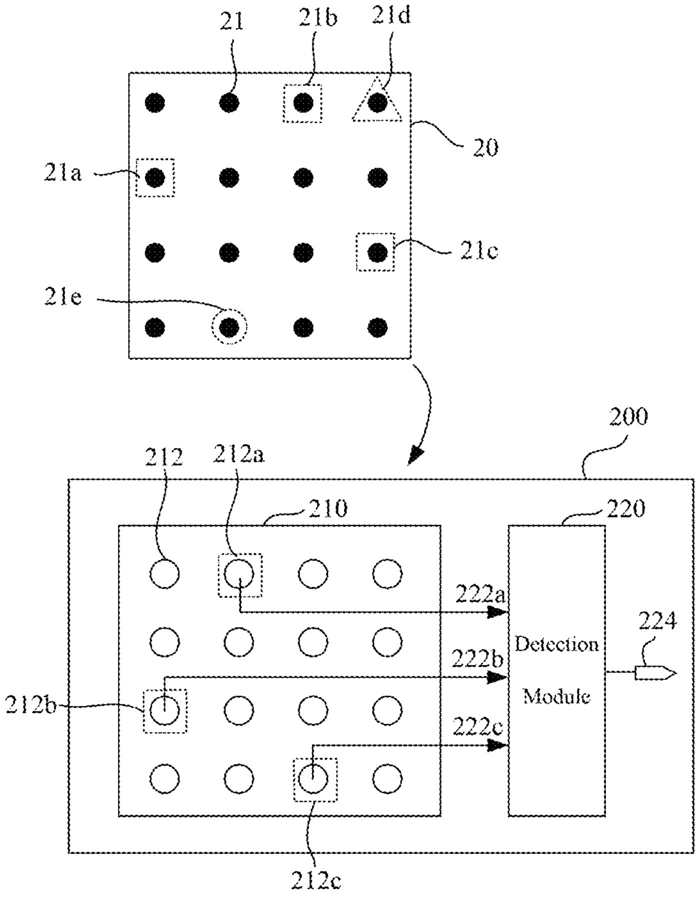
FIG. 4C is a diagram showing that the semiconductor device of FIG. 2 is rotated 90 degrees clockwise.

FIG. 4B illustrates another schematic circuit of the detection module 220 when the semiconductor device is incorrectly mounted onto the test apparatus. For example, the semiconductor device 20 shown in FIG. 2 may be rotated 90 degrees clockwise. After rotation, as shown in FIG. 4C, the signal terminal 21*e*, the ground terminal 21*a* and the ground terminal 21*b* of the semiconductor device 20 are aligned with the three ground contacts 212*a*, 212*b* and 212*c* in the connection region 210. As a result, when the semiconductor device 20 with the orientation shown in FIG. 4C is mounted on the test apparatus 200, the signal terminal 21*e*, the ground terminal 21*a* and the ground terminal 21*b* of the semiconductor device 20 are respectively coupled to the three ground contacts 212*a*, 212*b* and 212*c* of the test apparatus 200, and then are respectively coupled to the three inputs 222*a*, 222*b* and 222*c* of the detection module 220. Accordingly, as shown in the schematic circuit of FIG. 4B, the inputs 222*b* and 222*c* of the detection module 220 are respectively connected to the ground terminals 21*a* and 21*b* of the semiconductor device 20, but the input 222*a* of the detection module 220 is connected to the signal terminal 21*e* of the semiconductor device 20. That is, the semiconductor device 20 is incorrectly mounted onto the test apparatus 200. As the signal terminal 21*e* of the semiconductor device 20 may have a voltage greater than the ground voltage, it seems that an equivalent resistor Rx is coupled to the input 222*a* of the detection module 220. As the input 222*a* of the detection module 220 is not connected to ground voltage, the detection module 220 may output a logic low voltage (i.e., "0").

It could be understood that FIG. 4C is only an exemplary scenario that the semiconductor device is incorrectly mounted onto the test apparatus (i.e., 90 degrees rotated). In other embodiments, if the semiconductor device is incorrectly mounted onto the test apparatus in another way (for example, 180 degree rotated, 270 degree rotated, flipped, tilted, etc.), at least one of the inputs of the detection module is not grounded, and the detection module can also output a logic low voltage to indicate the incorrect connection between the semiconductor device and the test apparatus, which will not be elaborated herein.

Figure 5:
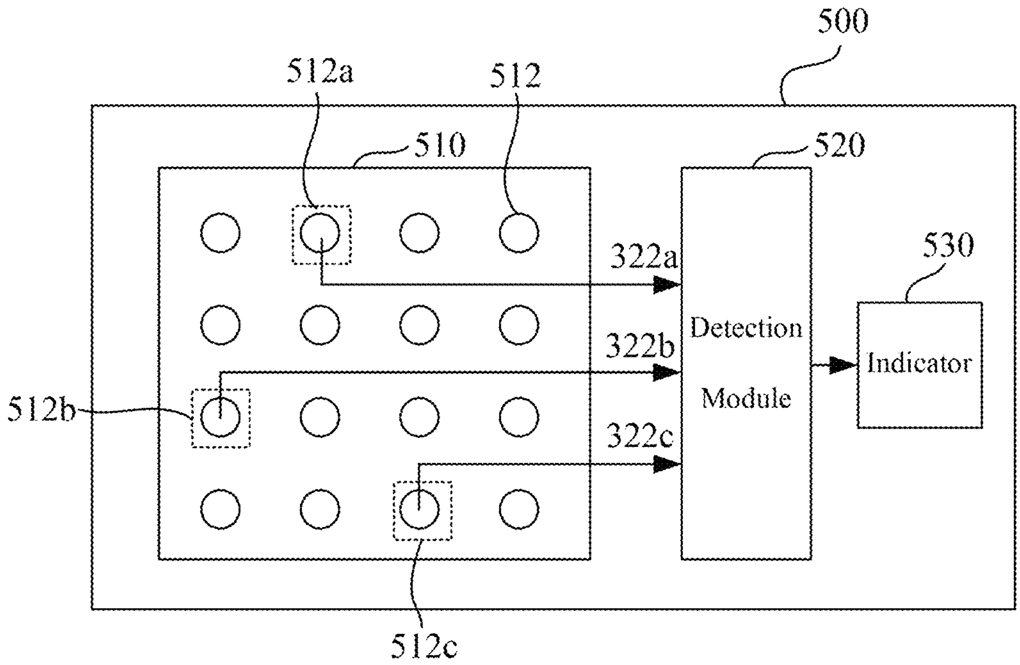
FIG. 5 is a diagram of a test apparatus according to an embodiment of the present application.

FIG. 5 illustrates a diagram of a test apparatus 500 according to an embodiment of the present application.

As shown in FIG. 5, the test apparatus 500 includes a connection region 510 for connecting a semiconductor device, and a plurality of contacts 512 are arranged in the connection region 510. The plurality of contacts 512 may include at least one ground contact (e.g., three ground contacts 512*a*, 512*b* and 512*c* shown in FIG. 5), at least one power contact, and at least one signal contact. The test apparatus 500 also includes a detection module 520. The connection region 510 and the detection module 520 may be similar as the connection region 210 and the detection module 220 shown in FIG. 2, and will not be elaborated herein.

The test apparatus 500 shown in FIG. 5 further includes an indicator 530 coupled to the output of the detection module 520. The indicator 530 can be a light indicator or a sound indicator. When the indicator 530 receives the first signal from the detection module 520, it can provide a notification to indicate that the semiconductor device under test is correctly mounted on the test apparatus 500.

Figure 6:
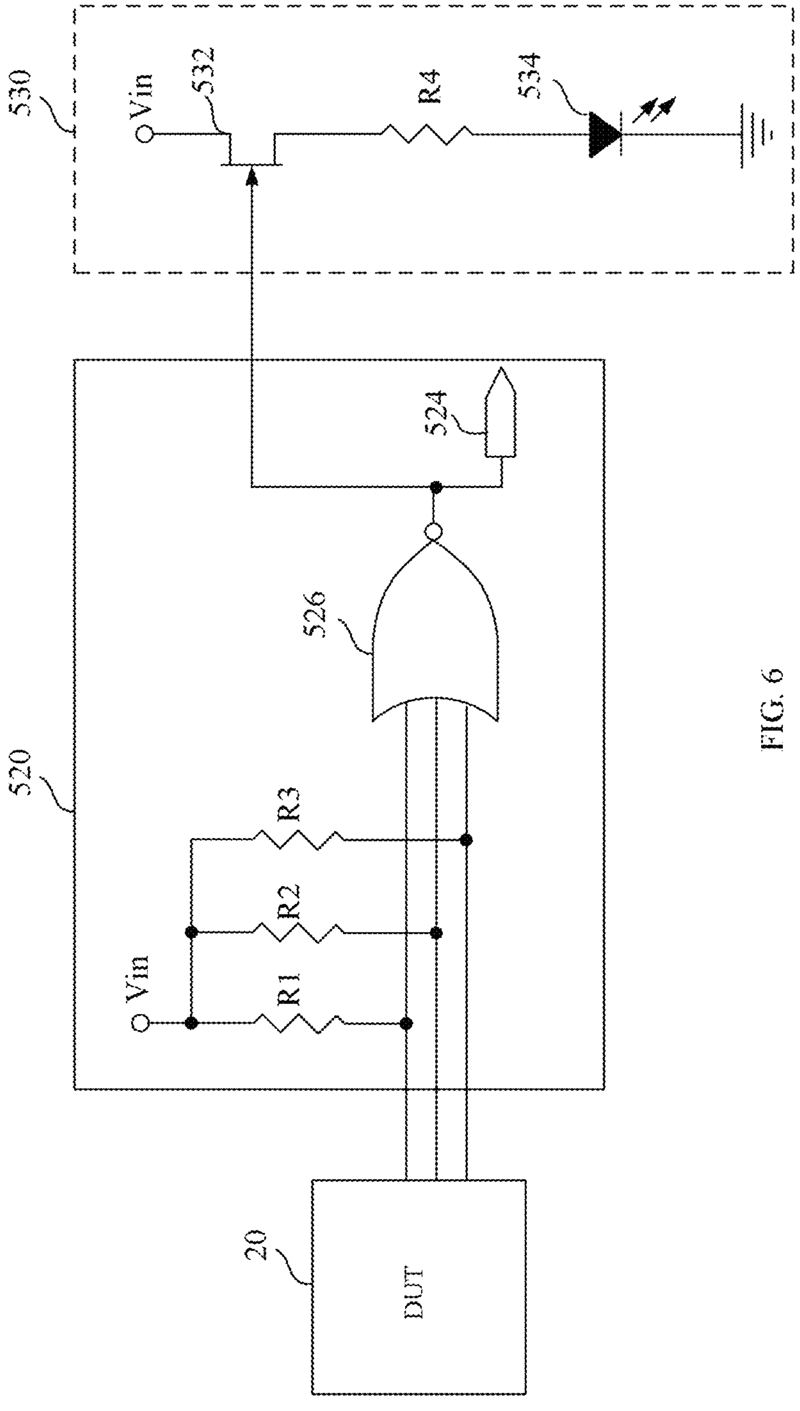
FIG. 6 is a circuit diagram of the test apparatus shown in FIG. 5 according to an embodiment of the present application.

In some embodiments, the indicator 530 may be a light indicator. For example, as shown in FIG. 6, the indicator 530 may include an LED 534. The LED 534 may be coupled to an external power supply Vin via a resistor R4 and a switch 532 (e.g., a MOSFET). The gate of the MOSFET is connected to the output 524 of the detection module 520. When the detection module 520 outputs a logic high voltage, the switch 532 is on and the LED 534 is activated to emit a visible light to indicate that the semiconductor device 20 is correctly mounted on the test apparatus 500. When the detection module 520 outputs a logic low voltage, the switch 532 is off and the LED 534 is not activated. In a case where the semiconductor device is mounted on the test apparatus by a user, the user can proceed with subsequent testing processes if the LED 534 is activated.

In some embodiments, the indicator 530 may be a sound indicator, and the sound indicator can provide a voice alert to indicate that the semiconductor device under test is correctly mounted on the test apparatus or the semiconductor device under test is incorrectly mounted on the test apparatus.

Figure 7:
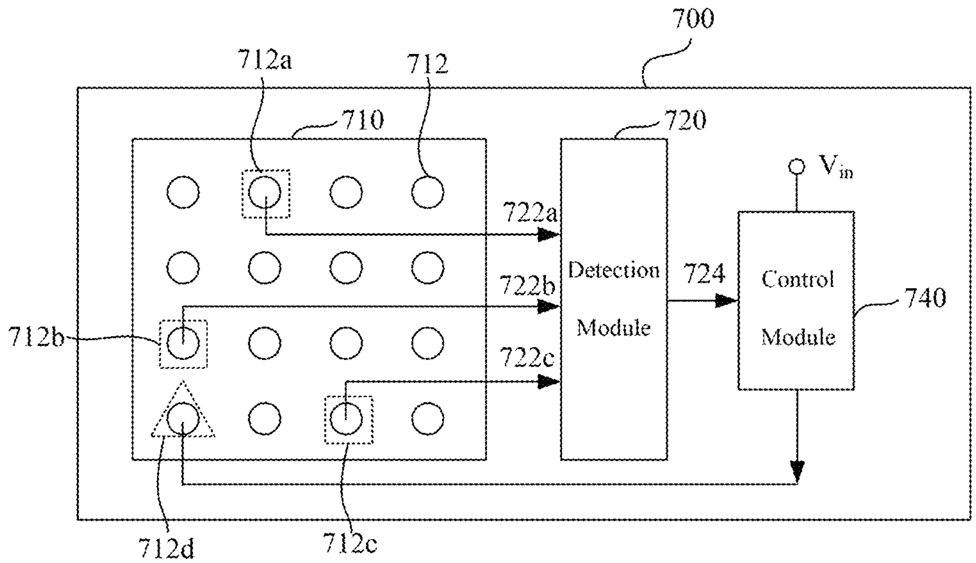
FIG. 7 is a diagram of a test apparatus according to another embodiment of the present application.

FIG. 7 illustrates a diagram of a test apparatus 700 according to an embodiment of the present application.

As shown in FIG. 7, the test apparatus 700 includes a connection region 710 for connecting to a semiconductor device, and a plurality of contacts 712 are arranged in the connection region 710. The plurality of contacts 712 may include at least one ground contact (e.g., three ground contacts 712*a*, 712*b* and 712*c* shown in FIG. 7), at least one power contact (e.g., a power contact 712*d* shown in FIG. 7), and at least one signal contact. The test apparatus 700 also includes a detection module 720. The connection region 710 and the detection module 720 may be similar as the connection region 210 and the detection module 220 shown in FIG. 2, and will not be elaborated herein.

The test apparatus 700 shown in FIG. 7 further includes a control module 740. The control module 740 is coupled between the output 724 of the detection module 720 and the power contact 712*d* of the test apparatus 700. When the control module 740 receives the first signal from the detection module 740, which indicates that the semiconductor device under test is correctly mounted on the test apparatus, the control module 740 can apply an external power supply Vin to the power contact 712*d* of the test apparatus 700 to proceed with subsequent testing processes. In some embodiments, the control module 740 may include a low-dropout (LDO) regulator, a load switch, or other suitable devices, which is not limited in the present application.

Figure 8:
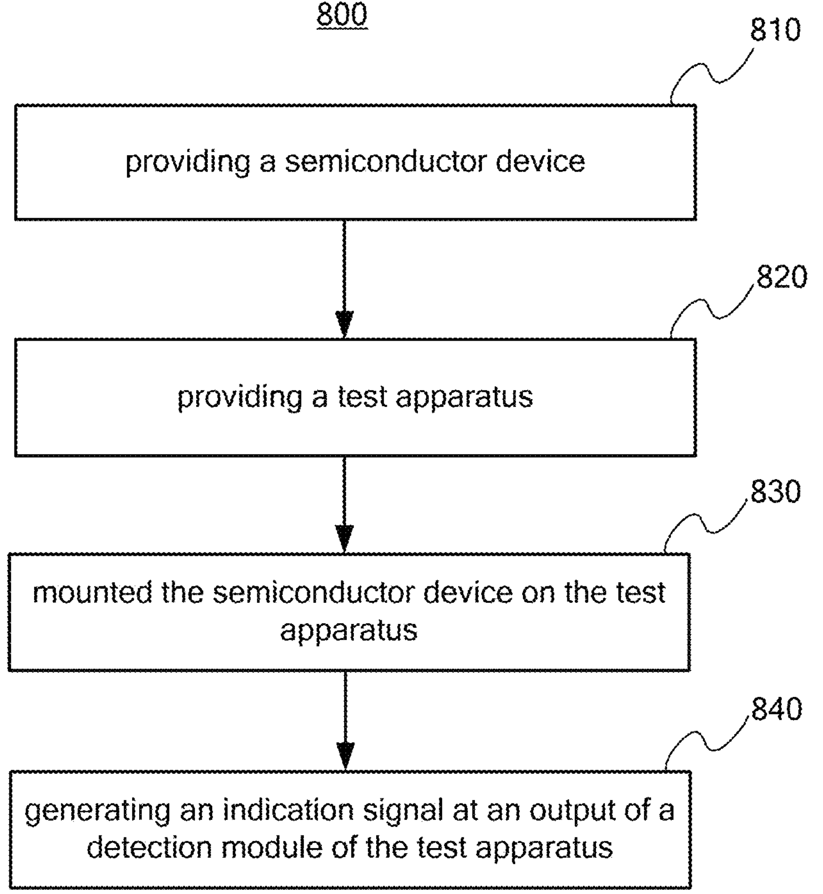
FIG. 8 is a flowchart illustrating a method for testing a semiconductor device according to an embodiment of the present application.

Referring to FIG. 8, a method 800 for testing a semiconductor device is illustrated according to an embodiment of the present application. For example, the method 800 may use the test apparatus 200 shown in FIG. 2, the test apparatus 500 shown in FIG. 5 or the test apparatus 700 shown in FIG. 7 to test a semiconductor device.

As illustrated in FIG. 8, the method 800 may start with providing a semiconductor device in block 810. The semiconductor device may include one or more ground terminals. Afterwards, in block 820, a test apparatus is provided. The test apparatus includes one or more ground contacts configured for coupling to the one or more ground terminals of the semiconductor device respectively. The test apparatus further includes a detection module having one or more inputs coupled to the one or more ground contacts respectively, and the detection module is configured to detect electrical conditions at the one or more ground contacts. In block 830, the semiconductor device is mounted on the test apparatus. Afterwards, in block 840, the detection module generates an indication signal at its output. The indication signal may have a first logic level if all of the one or more ground contacts are coupled to the one or more ground terminals of the semiconductor device, or the indication signal may have a second logic level different from the first logic level if at least one of the one or more ground contacts is not coupled to the one or more ground terminals of the semiconductor device.

More details about the method 800 may refer to the disclosure and drawings about the test apparatus disclosed above, and will not will not be elaborated herein.

The discussion herein included numerous illustrative figures that showed various portions of an apparatus and a method for testing a semiconductor device. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A test apparatus for testing a semiconductor device, wherein the semiconductor device comprises a plurality of ground terminals, and the test apparatus comprises:

a plurality of ground contacts configured for coupling to the plurality of ground terminals of the semiconductor device respectively; and a detection module having a plurality of inputs coupled to the plurality of ground contacts respectively, and configured to detect electrical conditions at the plurality of ground contacts;

wherein, when the semiconductor device is mounted on the test apparatus for testing, a first signal is generated at an output of the detection module if all of the plurality of ground contacts are coupled to the plurality of ground terminals of the semiconductor device, and a second signal different from the first signal is generated at the output of the detection module if at least one of the plurality of ground contacts is not coupled to the plurality of ground terminals of the semiconductor device; and wherein the semiconductor device comprises a power terminal, the test apparatus comprises a power contact configured for coupling to the power terminal of the semiconductor device, and the test apparatus further comprises:

a control module coupled between the output of the detection module and the power contact of the test apparatus, wherein the control module is configured to apply an external power supply on the power contact of the test apparatus when receiving the first signal from the output of the detection module.

2. The test apparatus of claim 1, wherein the detection module comprises a NOR gate, the first signal is a logic high voltage and the second signal is logical low voltage.

3. The test apparatus of claim 1, wherein the control module comprises a low-dropout regulator or a load switch.

4. The test apparatus of claim 1, further comprising:

an indicator coupled to the output of the detection module, wherein the indicator is configured to provide a notification to indicate that the semiconductor device is correctly mounted on the test apparatus, when receiving the first signal from the output of the detection module.

5. The test apparatus of claim 4, wherein the indicator comprises a light indicator or a sound indicator.

6. The test apparatus of claim 1, wherein the test apparatus comprises a test socket, and the plurality of ground contacts are Pogo pins.

7. The test apparatus of claim 1, wherein the detection module is formed on a flexible printed circuit board.

8. A method for testing a semiconductor device, comprising:

providing a semiconductor device comprising a power terminal and a plurality of ground terminals;

providing a test apparatus, wherein the test apparatus comprises:

a power contact configured for coupling to the power terminal of the semiconductor device;

a plurality of ground contacts configured for coupling to the plurality of ground terminals of the semiconductor device respectively;

a detection module having a plurality of inputs coupled to the plurality of ground contacts respectively, and configured to detect electrical conditions at the plurality of ground contacts; and a control module coupled between an output of the detection module and the power contact of the test apparatus;

mounting the semiconductor device on the test apparatus; and generating an indication signal at the output of the detection module, wherein the indication signal has a first logic level if all of the plurality of ground contacts are coupled to the plurality of ground terminals of the semiconductor device, and the indication signal has a second logic level different from the first logic level if at least one of the plurality of ground contacts is not coupled to the plurality of ground terminals of the semiconductor device; and applying, by the control module, an external power supply on the power contact of the test apparatus when receiving the indication signal having the first logic level from the output of the detection module.

9. The method of claim 8, wherein the detection module comprises a NOR gate, the indication signal has a logic high voltage if all of the plurality of ground contacts are coupled to the plurality of ground terminals of the semiconductor device, and the indication signal has a logic low voltage if at least one of the plurality of ground contacts is not coupled to the plurality of ground terminals of the semiconductor device.

10. The method of claim 8, wherein the control module comprises a low-dropout regulator or a load switch.

11. The method of claim 8, wherein the test apparatus further comprises an indicator coupled to the output of the detection module, and the method further comprises:

providing, by the indicator, a notification to indicate that the semiconductor device is correctly mounted on the test apparatus, when the indicator receives the indication signal having the first logic level from the output of the detection module.

12. The method of claim 11, wherein the indicator comprises a light indicator or a sound indicator.

13. The method of claim 8, wherein the test apparatus comprises a test socket, and the plurality of ground contacts are Pogo pins.

14. The method of claim 8, wherein the detection module is formed on a flexible printed circuit board.

* * * * *